(12) United States Patent
Shulman

(10) Patent No.: US 6,362,682 B2
(45) Date of Patent: Mar. 26, 2002

(54) COMMON-MODE FEEDBACK CIRCUIT AND METHOD

(75) Inventor: Dima David Shulman, Marlboro, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/107,480

(22) Filed: Jun. 30, 1998

(51) Int. Cl.$^7$ ................................................. G06G 7/12
(52) U.S. Cl. ...................... 327/562; 327/363; 327/563; 330/252; 330/260
(58) Field of Search ................................. 327/560–563, 327/363, 345, 355, 361; 330/252, 257–260, 261, 69, 253, 254, 278, 75

(56) References Cited

U.S. PATENT DOCUMENTS

| | | | | |
|---|---|---|---|---|
| 4,105,942 A | * | 8/1978 | Henry | 330/261 |
| 4,336,502 A | * | 6/1982 | Goto | 330/253 |
| 4,616,189 A | * | 10/1986 | Pengue, Jr. | 330/253 |
| 5,578,964 A | | 11/1996 | Kim et al. | 330/253 |

FOREIGN PATENT DOCUMENTS

EP    520751 A1    12/1992

OTHER PUBLICATIONS

David Irwin, Basis Engineering Circuit Analysis, third edition, 1990.*

Proceedings of the IEEE 1998 Custom Integrated Circuits Conference, May 11–14, 1998, pp. 428–430.

K. R. Laker and W. M. C. Sansen, "Design of Analog Integrated Circuits and Systems," New York, McGraw–Hill, 1994, ch. 6, pp. 601–607.

S. D. Willingham et al., "A BiCMOS Low–Distortion 8–MHz Low–Pass Filter," IEEE J. Solid–State Circuits, vol. 28, No. 12, pp. 1234–1245, Dec. 1993.

Caiulo, G. et al. "Video CMOS Power Buffer with Extended Linearity." IEEE Journal of Solid–State Circuits. Jul. 28, 1993, No. 7, New York. pp. 845–848.

* cited by examiner

Primary Examiner—Timothy P. Callahan
Assistant Examiner—Minh Nguyen

(57) ABSTRACT

The common-mode feedback circuit generates currents representing the output voltages of a fully differential amplifier, and sums these current to produce a summation current. Based on the comparison of the summation current to a reference current, the common-mode feedback circuit generates a feedback voltage for stabilizing the fully differential amplifier.

11 Claims, 2 Drawing Sheets ial amplifier 10 are prevented by the common-mode feedback circuit 100.

COMMON-MODE FEEDBACK CIRCUIT AND METHOD

BACKGROUND OF THE INVENTION

1. Field of the Invention

The present invention relates to a common-mode feedback circuit.

2. Description of the Prior Art

The purpose of a common-mode feedback circuit is to stabilize an associated fully differential amplifier. A stable fully differential amplifier can only be achieved when the bandwidth of the common-mode feedback circuit is greater than the bandwidth of the fully differential amplifier. Also, the common-mode feedback circuit needs to be stable as well. Instability within a common-mode feedback circuit is caused by, for example, high impedance nodes. Traditionally, capacitors are used to compensate for high impedance nodes, but the addition of capacitors decreases the bandwidth of the common-mode feedback circuit, and, thus, places a restriction on the bandwidth of the fully differential amplifier.

SUMMARY OF THE INVENTION

A common-mode feedback circuit according to the present invention includes a converting circuit converting the output voltages of a fully differential amplifier into currents, and a summation circuit summing the currents to produce a summation current. The summation current is then compared by a comparison circuit to reference current. A feedback circuit generates a feedback voltage for controlling the fully differential amplifier based on the results of the comparison. Advantageously, the common mode feedback circuit according to the present invention does not include any high impedance nodes or suffer from the problems and disadvantages associated therewith.

DESCRIPTION OF THE DRAWINGS

The present invention will become more fully understood from the detailed description given hereinbelow and the accompanying drawings which are given by way of illustration only, wherein like reference numerals designate corresponding parts in the various drawings, and wherein.

DETAILED DESCRIPTION OF THE PREFERRED EMBODIMENTS

Figure 1:
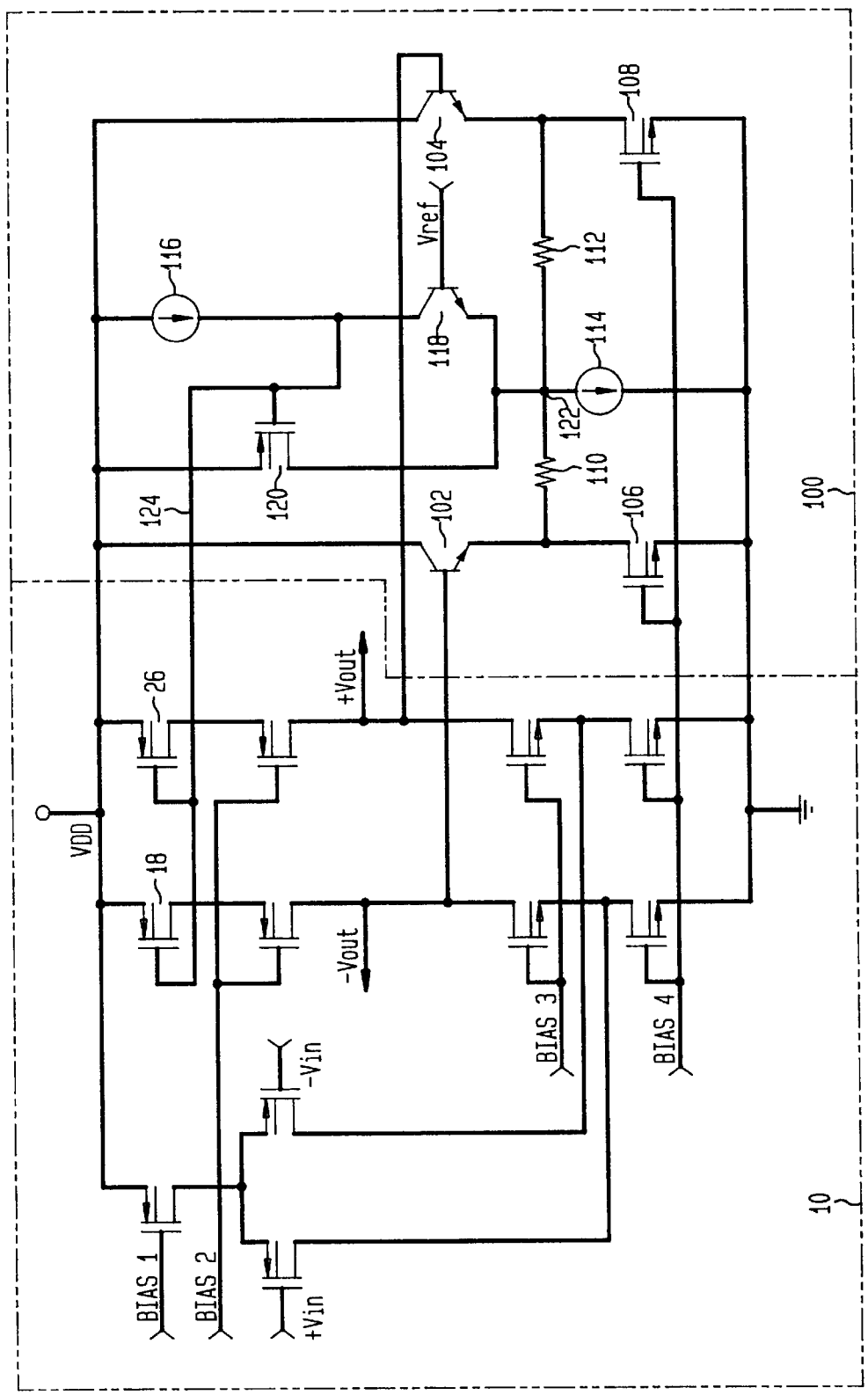
FIG. 1 illustrates an embodiment of the common-mode feedback circuit according to the present invention applied to a conventional fully differential amplifier.

FIG. 1 illustrates an embodiment of the common-mode feedback circuit according to the present invention applied to the fully differential amplifier 10. Because the fully differential amplifier 10 in FIG. 1 is well-known, a description of the structure and operation of the fully differential amplifier 10 will be omitted.

The common-mode feedback circuit 100 includes first and second bipolar transistors 102 and 104, which receive the output voltages of the fully differential amplifier 10 at their gates, respectively. The first bipolar transistor 102 is connected in series with a first N-MOS transistor 106 between the power source voltage VDD and ground. The second bipolar transistor 104 is connected in series with a second N-MOS transistor 108 between the power source voltage VDD and ground. The gates of the first and second N-MOS transistors 106 and 108 are connected to the fourth fixed bias.

A first and second resister 110 and 112 are connected in series between the emitters of the first and second bipolar transistors 102 and 104. A first constant current source 114 is connected between the junction of the first and second resisters 110 and 112 and ground. Hereinafter, the junction between the first and second resistors 110 and 112 will be referred to as node 122.

As further shown in FIG. 1, a second constant current source 116 is connected in series with a reference bipolar transistor 118 between the power source voltage VDD and the node 122. A feedback P-MOS transistor 120 is connected in parallel to the second constant current source 116 and the reference bipolar transistor 118. The gate of the reference bipolar transistor 118 receives a reference voltage Vref which places the reference bipolar transistor 118 in the active state. The gate of the feedback P-MOS transistor 120 is connected to the junction between the second constant current source 116 and the reference bipolar transistor 118. Furthermore, a feedback path 124 supplies the voltage at the gate of the feedback P-MOS transistor 120 to the gates of the first and second resistive P-MOS transistors 18 and 26 in the fully differential amplifier 10.

The operation of the common-mode feedback circuit 100 will now be described with respect to an increase in the output voltages of the fully differential amplifier 10. As the output voltages of the fully differential amplifier 10 increase, more current flows through the first and second bipolar transistors 102 and 104. As a result, the currents flowing through the first and second resisters 110 and 112 to the node 122 increases.

The current flowing from the node 122 to ground is fixed by the first constant current source 114. The current flowing to the node 122 via the reference bipolar transistor 118 is substantially fixed by the application of the reference voltage Vref to the gate of the reference bipolar transistor 118 and the provision of the second constant current source 116 except for a negligible base current in the reference bipolar transistor 118.

Accordingly, any difference between (1) the current flowing through the reference bipolar transistor 118 to the node 122 and (2) the current through the first and second resisters 110 and 112 to the node 122 affects the current flowing through of the feedback P-MOS transistor 120 to the node 122. Consequently, the current flowing through the feedback P-MOS transistor 120 decreases by the same amount of increase in total current through the first and second resistors 110 and 112. With a decrease in the current flowing through the feedback P-MOS transistor 120, the voltage at the gate of the feedback P-MOS transistor 120 increases. The feedback path 124 supplies this increased voltage to the first and second resistive P-MOS transistors 18 and 26 of the fully differential amplifier 10. As a result, less current flows through the second and fourth resistive P-MOS transistors 18 and 26, and the output voltages from the fully differential amplifier 10 decrease.

While the operation of the common-mode feedback circuit 100 has been described respect to an increase in the output voltages of the fully differential amplifier 10, it is to be understood that the common-mode feedback circuit 100 operates in a similar, but opposite, manner when the output voltages of the fully differential amplifier 10 decrease. Both increases and decreases in the output voltages of the differential amplifier 10 are made with respect to the reference voltage Vref. Namely, the common-mode feedback circuit 100 serves to stabilize the output voltages around the reference voltage Vref.

Unlike conventional common-mode feedback circuits, the common-mode feedback circuit 100 does not rely upon a comparison of voltages to generate the feedback voltage. Instead, the common-mode feedback circuit 100 is a current-mode common-mode feedback circuit that generates a feedback voltage based on the comparison of currents representing the output voltages of fully differential amplifier with a reference current. The reference current in the common-mode feedback circuit 100 corresponds to the reference voltage Vref; and therefore, the common-mode feedback circuit 100 stabilizes the output voltages of the fully differential amplifier 10 about this reference voltage Vref. Also, in contrast to conventional common-mode feedback circuits, the common mode feedback circuit 100 does not include any high impedance nodes, or suffer from the problems and disadvantages related thereto.

Furthermore, it should be noted in that at low frequencies the gain of the feedback transistor 120 controls the input impedance at the emitter of the reference bipolar transistor 118. However, as the frequency increases, the gain of the feedback transistor 120 decreases and the effect of this gain on the input impedance at the emitter of the reference bipolar transistor 118 decreases. At higher frequencies, the input impedance at the emitter of the reference bipolar transistor 118 is determined by the transconductance of the reference bipolar transistor 118 and the parasitic capacitance with respect thereto. The two poles associated with the emitter of the reference bipolar transistor 118 and the gate of the feedback P-MOS transistor 120 interact with each other, and a complex-pole pair may be created, which is accompanied by undesirable peaking in the frequency response. To avoid this complex-pole pair, the transconductance of the reference bipolar transistor 118 should be larger than that of the feedback P-MOS transistor 120. This is easily accomplished in the BiCMOS (Bipolar-CMOS) implementation discussed above with respect to FIG. 1, because higher transconductances can be achieved with bipolar transistors than with their MOS counterparts. It should be understood however, that implementations of the present invention can be made using any other silicon technologies as long as the above rule is maintained.

Figure 2:
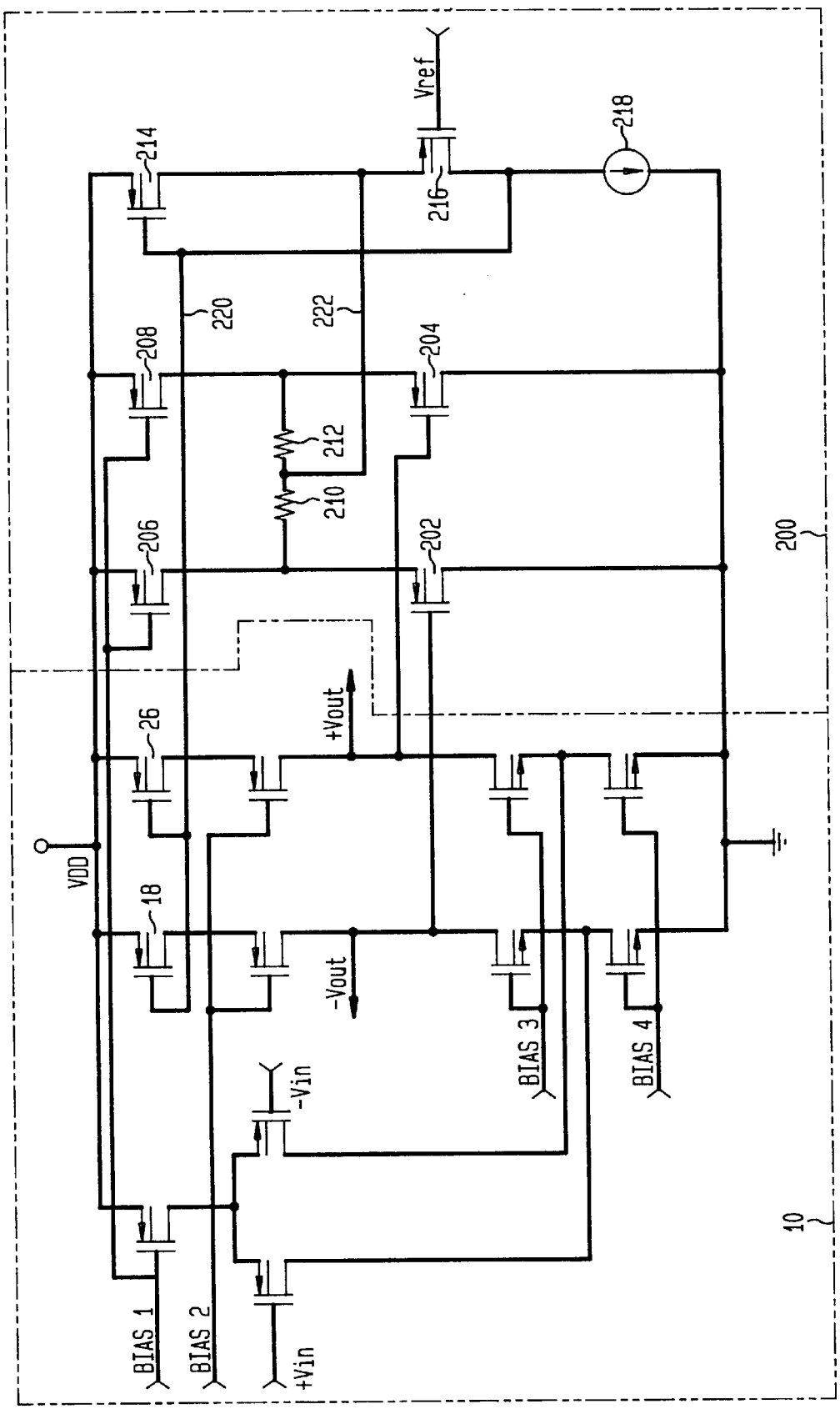
FIG. 2 illustrates another embodiment of the common-mode feedback circuit according to the present invention applied to the conventional fully differential amplifier.

While the embodiment of the present invention discussed above with respect to FIG. 1 operates well when the power source voltage VDD is greater than or equal to 3 volts, the common-mode feedback circuit of FIG. 1 is not applicable to low-power fully differential amplifiers. FIG. 2 illustrates another embodiment of the common-mode feedback circuit according to the present invention, which is applicable to low-power fully differential amplifiers. For ease of description, however, the common-mode feedback circuit 200 of FIG. 2 has been shown applied to the fully differential amplifier 10.

As shown in FIG. 2, the output voltages of the fully differential amplifier 10 are respectfully connected to the gates of a first P-MOS transistor 202 and a second P-MOS transistor 204 in the common-mode feedback circuit 200. The first P-MOS transistor 202 is connected in series with a third P-MOS transistor 206 between the power source voltage VDD and ground. The second P-MOS transistor 204 is also connected in series with a fourth P-MOS transistor 208 between the power source voltage VDD and ground. The gates of the third and fourth P-MOS transistors 206 and 208 are connected to the first fixed bias of the fully differential amplifier 10.

A first and second resister 210 and 212 are connected in series between the sources of the first and second P-MOS transistors 202 and 204. As further shown in FIG. 2, a feedback P-MOS transistor 214, a reference P-MOS transistor 216, and a constant current source 218 are connected in series between the power source voltage VDD and ground. The source of the reference P-MOS transistor 216 is connected to the junction between the first and second resisters 210 and 212. Hereinafter the junction between the first and second resisters 210 and 212 and the junction between the feedback P-MOS transistor 214 and the reference P-MOS transistor 216 are collectively referred to as node 222.

The gate of the reference P-MOS transistor 216 is connected to a reference voltage Vref, while the gate of the feedback P-MOS transistor 214 is connected to the drain of the reference P-MOS transistor 216. A feedback path 220 also connects the gate of the feedback P-MOS transistor 214 to the gates of the first and second resistive P-MOS transistors 18 and 26 in the fully differential amplifier 10.

The operation of the common-mode feedback circuit 200 will now be described with respect to an increase in the output voltages of the fully differential amplifier 10. As the output voltages of the filly differential amplifier 10 increase, more current flows through the first and second P-MOS transistors 202 and 204. As a result, the currents flowing through the first and second resisters 210 and 212 increases.

The current flow from the node 222 to ground is fixed by the application of the reference voltage Vref to the reference P-MOS transistor 216 and the constant current source 218. Accordingly, any difference between (1) the current flowing from the node 222 through the reference P-MOS transistor 216 and (2) the current flowing to the node 222 from the first and second resistors 210 and 212 affects the current flowing through the feedback P-MOS transistor 214. Consequently, the current flowing through the feedback P-MOS transistor 214 decreases by the same amount of increase in total current through the first and second resistors 210 and 212. With a decrease in the current flowing through the feedback P-MOS transistor 214, the voltage at the gate of the feedback P-MOS transistor 214 increases. The feedback path 220 supplies this increased voltage to the gates of the first and second resistive P-MOS transistors 18 and 26 in the fully differential amplifier 10. As a result, less current flows through the first and second resistive P-MOS transistors 18 and 26, and the output voltages from the fully differential amplifier 10 decrease.

Unlike conventional common-mode feedback circuits, the common-mode feedback circuit 200 does not rely upon a comparison of voltages to generate the feedback voltage. Instead, the common-mode feedback circuit 200 is a current-mode common-mode feedback circuit that generates a feedback voltage based on the comparison of currents representing the output voltages of the fully differential amplifier with a reference current. The reference current in the common-mode feedback circuit 200 corresponds to the reference voltage Vref; and therefore, the common-mode feedback circuit 200 stabilizes the output voltages of the fully differential amplifier 10 about this reference voltage Vref. Also, in contrast to conventional common-mode feedback circuits, the common mode feedback circuit 200 does not include any high impedance nodes, or suffer from the problems and disadvantages related thereto. Furthermore, the common-mode feedback circuit 200 operates even when powered at low voltage levels.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A common-mode feedback circuit, comprising:
    a first transistor passing a first current in response to a first output voltage of a fully differential amplifier;
    a second transistor passing a second current in response to a second output voltage of the fully differential amplifier;
    a summation circuit summing the first and second currents to produce a summation current;
    a reference current generator generating a reference current;
    a node receiving the reference current on a first path and the summation current on a second path, and connected to a third path such that a feedback current on the third path changes by a difference between the reference current and the summation current, wherein the second and third paths are physically separated; and
    a feedback circuit generating a feedback control voltage for controlling the fully differential amplifier based on the feedback current.

2. The circuit of claim 1, wherein said first and second transistors are bipolar transistors.

3. The circuit of claim 1, wherein said first and second transistors are metal-oxide-semiconductor transistors.

4. The circuit of claim 1, wherein said summation circuit comprises:
    first and second resistors in said first and second paths, respectively.

5. The circuit of claim 4, wherein said feedback circuit comprises:
    a feedback transistor disposed in said third path, and having a gate providing said feedback control voltage.

6. The circuit of claim 5, wherein said feedback transistor is a metal-oxide-semiconductor transistor.

7. The circuit of claim 1, further comprising
    a constant current source connected to said node by a fourth path.

8. The circuit of claim 7, wherein said feedback circuit comprises:
    a feedback transistor disposed in said third path, and having a gate providing said feedback control voltage.

9. The circuit of claim 8, wherein said feedback transistor is a metal-oxide-semiconductor transistor.

10. A common-mode feedback method, comprising:
    generating a first current through a response to a first output voltage of a fully differential amplifier;
    generating a second current in response to a second output voltage of the fully differential amplifier;
    summing the first and second currents to produce a summation current;
    generating a reference current;
    receiving, at a node, the reference current on a first path and the summation current on a second path;
    placing a feedback current on a third path connected to the node such that the feedback current changes by a difference between the reference current and the summation current, wherein the second and third paths are physically separated; and
    generating a feedback control voltage for controlling the fully differential amplifier based on the feedback current.

11. The method of claim 10, wherein said generating a feedback control voltage step comprises:
    converting said feedback current into a feedback voltage; and
    outputting said feedback voltage to said fully differential amplifier.

* * * * *